United States Patent
Verhoeven et al.

(10) Patent No.: US 7,224,439 B2
(45) Date of Patent: May 29, 2007

(54) METHOD AND IMAGING APPARATUS FOR IMAGING A STRUCTURE ONTO A SEMICONDUCTOR WAFER BY MEANS OF IMMERSION LITHOGRAPHY

(75) Inventors: Martin Verhoeven, Radebeul (DE); Thomas Zell, Dresden (DE)

(73) Assignee: Infineon Technologies AG, Munich (DE)

( * ) Notice: Subject to any disclaimer, the term of this patent is extended or adjusted under 35 U.S.C. 154(b) by 202 days.

(21) Appl. No.: 10/986,288

(22) Filed: Nov. 12, 2004

(65) Prior Publication Data

US 2005/0117135 A1 Jun. 2, 2005

(30) Foreign Application Priority Data

Nov. 27, 2003 (DE) ................. 103 55 301

(51) Int. Cl.
*G03B 27/43* (2006.01)
(52) U.S. Cl. .................... 355/67; 355/30; 355/53; 378/34; 378/35; 250/492.1; 250/492.2
(58) Field of Classification Search ............ 355/53, 355/67, 72, 75
See application file for complete search history.

(56) References Cited

U.S. PATENT DOCUMENTS

| 5,673,134 | A | 9/1997 | Oka et al. | |
|---|---|---|---|---|
| 2002/0045109 | A1* | 4/2002 | Yamada | 430/5 |
| 2002/0072194 | A1 | 6/2002 | Nakao et al. | |
| 2006/0077370 | A1* | 4/2006 | Mulkens et al. | 355/67 |

FOREIGN PATENT DOCUMENTS

JP 10-303114 A 11/1998

* cited by examiner

*Primary Examiner*—D. Rutledge
(74) *Attorney, Agent, or Firm*—Edell, Shapiro & Finnan, LLC

(57) ABSTRACT

The hydrodynamic effects—which occur during immersion lithography as a result of the movement of the semiconductor wafer—in a liquid preferably provided between the last lens surface of the projection system and the semiconductor wafer can be avoided by means of a movable illumination region for illuminating a cutout of a mask containing a structure to that can be imaged onto the semiconductor wafer. A scan movement of the mask and the semiconductor wafer can be either reduced or entirely avoided by means of a movement of the illumination region.

8 Claims, 5 Drawing Sheets

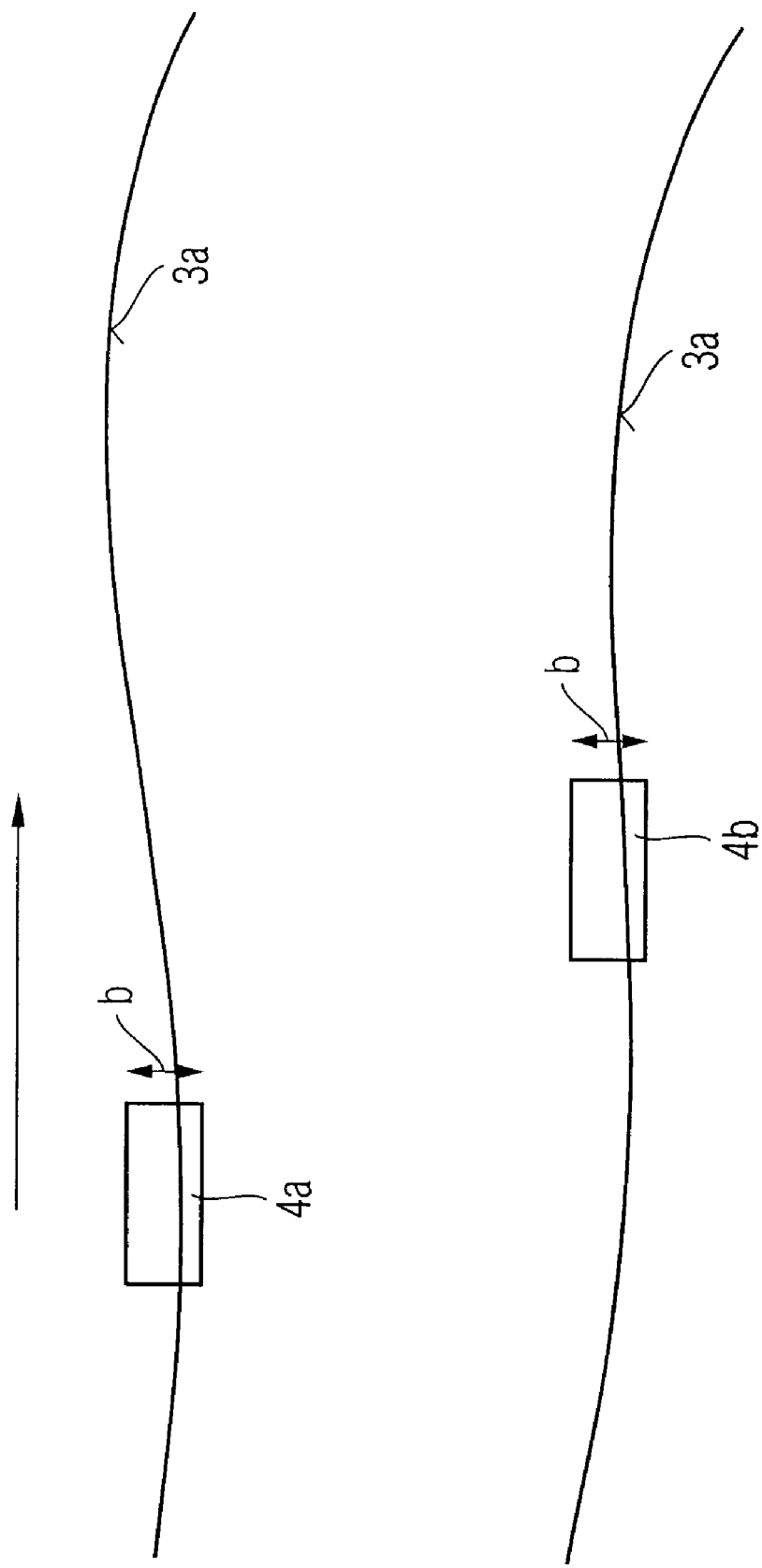

METHOD AND IMAGING APPARATUS FOR IMAGING A STRUCTURE ONTO A SEMICONDUCTOR WAFER BY MEANS OF IMMERSION LITHOGRAPHY

CROSS REFERENCE TO RELATED APPLICATIONS

This application claims priority under 35 USC § 119 to German Application No. DE 103 55 301.0, filed on Nov. 27, 2003, and titled "Method and Imaging Apparatus for Imaging a Structure onto a Semiconductor Wafer by Means of Immersion Lithography," the entire contents of which are hereby incorporated by reference.

FIELD OF THE INVENTION

The present invention relates to a method and apparatus for imaging a structure from a mask onto a semiconductor wafer. More particularly, a cutout of the mask is exposed with an illumination region arranged above the mask. A partial structure contained in the exposed cutout is imaged onto the semiconductor wafer by means of a projection system, and a liquid fills a gap between the semiconductor wafer and a lens surface of the projection system that is nearest to the semiconductor wafer.

BACKGROUND

Development in the fabrication of microelectronic components tends toward an increasing integration density. In the case of DRAM (Dynamic Random Access Memory) memory chips, for example, it is prefarable to obtain an increase in storage capacity with the size of the memory chip remaining the same. Accordingly, it is desirable to increase miniaturization of structures that are to be formed in a semiconductor wafer.

A process step in the fabrication of micrometer-and nanometer-scale structures is a lithographic imaging of the structure from a mask onto the semiconductor wafer.

FIG. 2 diagrammatically illustrates a conventional apparatus for lithographic imaging in the fabrication of DRAM memory chips. A slotted illumination region 1 is provided above the mask 2, which is arranged in one plane and contains the structure to be imaged. The illumination region may, for example, have a length of 104 mm and a width of 8 mm and the rectangular mask 2 may have a length of 104 mm and a width of 132 mm. By means of the illumination region 1, a strip-type cutout on the mask 2 is illuminated and a partial structure contained in the cutout is imaged onto the semiconductor wafer 3 by means of a projection system 5, which generally de-magnifies the partial structure, by a factor of 0.25, for example. In order to illuminate, successively, the entire mask 2 and to image the structure contained in mask 2, mask 2 is moved beneath the illumination region 1 in the direction illustrated by an arrow in FIG. 2a. A movement of the semiconductor wafer 3 is coupled with the movement of mask 2. In order that the entire structure contained in mask 2 is imaged onto the semiconductor wafer 3, the semiconductor wafer 3 is moved in an opposite direction to mask 2. The opposite direction results from the interchange of right and left caused by the projection system 5. Depending on the demagnification factor of the projection system 5, the speed of the mask will be greater than that of the semiconductor wafer 3. Given a demagnification factor of 0.25, the speed at which mask 2 moves is four times greater than that of the semiconductor wafer 3.

FIG. 2a illustrates the positions of mask 2 and the semiconductor wafer 3 at the beginning of an imaging of the structure contained in mask 2. Situated above mask 2 is the illumination region 1, which is arranged above an optical axis of the projection system 5, said optical axis being indicated by the dashed line, and does not alter its position during the imaging. The mask 2 is moved in the direction indicated by the black arrow at shown in FIG. 2a during the imaging operation. At the same time, the semiconductor wafer 3 is moved in the opposite direction to the mask 2 as indicated by the black arrow at the semiconductor wafer 3. FIG. 2b illustrates the positions of mask 2 and semiconductor wafer 3 at the end of the imaging. As is evident, mask 2 has migrated from one side of the optical axis to the other side of the optical axis, while the semiconductor wafer 3 has migrated in the opposite direction. There is an air gap situated between semiconductor wafer 3 and lens surface 7.

By means of the described movement of mask and semiconductor wafer, the structure contained in the mask is scanned and progressively imaged onto the semiconductor wafer. The mask generally contains structures for one or a plurality of microelectronic components, such as memory chips for example. In the manner described above, the structure contained in the mask can be imaged once onto the semiconductor wafer. If the semiconductor wafer has a diameter of 300 mm, for example, then the structure contained in the mask can be imaged onto the semiconductor wafer approximately 150 times. In order to repeat an imaging, the semiconductor wafer, which is likewise arranged in an x-y plane, is displaced in said plane, so that, during a renewed scan operation, the partial structures are imaged onto as yet unexposed areas of the semiconductor wafer.

Step and scan systems are currently used in the production of DRAM memory chips. This system employs imaging apparatus that scan the structure contained in the mask and progressively exposing a section on the semiconductor wafer on which the structure is imaged, and, after the exposure of the section, migrate to a next section by means of a movement of the semiconductor wafer in the x-y plane and expose said next section.

The applicability of the imaging apparatus described, which effects illumination for example with a light wavelength of 193 nanometers, to ever smaller feature sizes of, for example, less than 70 nanometers can be extended with the aid of immersion lithography. During immersion lithography, a liquid is provided between the semiconductor wafer and the lens surface of the projection system that is nearest to the semiconductor wafer. The liquid completely fills the gap between the semiconductor wafer and the lens surface, thereby avoiding a light transition from lens to air. The resolution capability of the projection system is increased by avoiding the transition.

The liquid that fills the air gap, also called immersion liquid, has to satisfy a plurality of requirements. It should be transparent to the light wavelength employed and should have a predetermined refractive index. The liquid should additionally have a sufficiently low viscosity, so that sheer forces do not occur both in the event of a scan movement executed at high speed and in the event of a step movement. The term step movement denotes the movement of the semiconductor wafer that is necessary in order to bring the semiconductor wafer to a new position with regard to the projection system for a repetition of the imaging, so that the structure is projected onto an as yet unexposed section of the semiconductor wafer.

There are a number of disadvantages associated with the immersion liquid between the semiconductor wafer and the lens surface of the projection system. These disadvantages result from the scan movement of the mask and the movement of the semiconductor wafer that is coupled thereto. The movement of the semiconductor wafer relative to the immersion liquid generates turbulence and microbubbles in the immersion liquid. Such hydrodynamic effects reduce the quality of the imaging of the structure onto the semiconductor wafer. Furthermore, the immersion liquid generates a mechanical coupling between projection system and semiconductor wafer. Accordingly, a vibration in the semiconductor wafer is transmitted to the lens system, which again adversely affects the imaging quality.

SUMMARY

It is an aspect of the present invention to provide a method for imaging a structure from a mask onto a semiconductor wafer with the aid of an immersion lithography which avoids hydrodynamic effects in an immersion liquid which are brought about by a movement of the semiconductor wafer and reduce an imaging quality. Moreover, it is an object of the invention to provide an imaging apparatus for carrying out the method.

A further aspect of the present invention provides a method for imaging a structure from a mask onto a semiconductor wafer, a cutout of the mask provided in an x-y plane can be exposed by an illumination region arranged above the mask. A partial structure contained in the exposed cutout can be imaged onto the semiconductor wafer by means of a projection system, a liquid filling a gap between the semiconductor wafer and a lens surface of the projection system that is nearest to the semiconductor wafer. According to the invention, the illumination region is moved with respect to the mask and the projection system so that the structure prescribed by the mask is imaged onto the semiconductor wafer by a sequence of imaging of the partial structure respectively contained in the successively exposed cutouts.

In the case of the method according to the invention, the illumination region is preferably provided such that it is movable. By means of a scan movement of the illumination region above the mask, the entire structure contained in the mask can advantageously be imaged onto the semiconductor wafer without having to move the mask and the semiconductor wafer during the imaging operation. Obviating movement of the mask and the semiconductor wafer also avoids the hydrodynamic effects in the liquid that are brought about by the movement of the semiconductor wafer relative to the liquid and are disadvantageous for an imaging quality. If the semiconductor wafer no longer moves with regard to the liquid, then it is also no longer possible for turbulence or microbubbles to form in the liquid, as a result of which the imaging quality is considerably improved. The mechanical vibrations that are brought about by the movement of the semiconductor wafer and are transmitted to the projection system through the liquid and impair the imaging quality can likewise be avoided through a reduction of movement of the semiconductor wafer.

The illumination region is preferably provided with a slotted form. In this case, the illumination region is provided such that a length of a long side of the illumination region has at least a length of an edge of the rectangular mask, so that a strip-type cutout of the mask is illuminated. The entire mask is then completely illuminated by a continuous movement of the illumination region perpendicular to the edge of the mask.

The illumination region is preferably moved in precisely one direction.

In an advantageous manner, the mask and the semiconductor wafer, during the imaging of the structure, are preferably provided with a fixed position in the x-y plane with respect to the projection system. If the semiconductor wafer and the mask are situated in a fixed position during the imaging, then the above described disadvantages are advantageously avoided for the imaging quality caused by the movement of the semiconductor wafer with regard to the liquid.

In an advantageous manner the mask and the semiconductor wafer during the imaging of the structure, are moved in the x-y plane in each case with respect to the projection system. If in the illumination region the mask and the semiconductor wafer are moving, then the speeds of the movements of the semiconductor wafer and the mask can advantageously be reduced compared with the speeds of the movements which they execute in the case of a static illumination region, with an imaging speed remaining the same. Reducing the speeds likewise advantageously prevents the production of turbulence and microbubbles in the liquid. Through the movement of mask and semiconductor wafer, a movement amplitude of the illumination region is reduced and the image field is thus advantageously reduced again.

Preferably, the mask is moved with a direction antiparallel and the semiconductor wafer is moved with a direction parallel to the direction of movement of the illumination region. In order to reduce the movement amplitude of the illumination region, the mask is moved in an opposite direction to the illumination region and, coupled to the movement of the mask, the movement of the semiconductor wafer is effected in an opposite direction to the movement of the mask.

In order to repeat the imaging of the structure on the semiconductor wafer, in an advantageous manner, a contact between the semiconductor wafer and the liquid can be interrupted. The semiconductor wafer is brought to a new position with regard to the projection system, so that the repeated imaging of the structure is effected onto an as yet unexposed section of the semiconductor wafer. The liquid can then be provided between the semiconductor wafer and the lens surface and the semiconductor wafer can be brought into a focal range of the projection system and the imaging can be repeated by the method described. The contact between the semiconductor wafer and the liquid is interrupted prior to the positioning of the semiconductor wafer. The disadvantageous hydrodynamic effects in the liquid that are brought about by the positioning movements of the semiconductor wafer can advantageously be avoided as a result. The only movements that are still transmitted to the liquid are nanometer-scale focusing movements in a z direction perpendicular to the x-y plane.

In order to interrupt the contact between the semiconductor wafer and the liquid, the semiconductor wafer is preferably moved away from the lens surface in the z direction at least until contact with the liquid is broken.

In order to bring the semiconductor wafer to the new position with regard to the projection system, the semiconductor wafer is advantageously moved in the x-y plane and subsequently moved in the z direction toward the lens surface until the gap that is to be essentially completely filled by the liquid arises between the semiconductor wafer and the lens surface.

An imaging apparatus for an immersion lithography is provided with an illumination region for exposing a cutout of a mask, which is provided in an x-y plane below the illumination region and contains a structure to be imaged. The imaging apparatus is provided with a projection system for imaging a partial structure contained in the cutout onto a semiconductor wafer and a liquid that fills a gap between the semiconductor wafer and the nearest lens surface of the projection system. According to the invention, the illumination region is provided such that it is movable in the x-y plane. The essential advantage of the imaging apparatus is that the movable illumination region enables a scan movement of the illumination region. As a result, the movements of mask and semiconductor wafer can be reduced, or be entirely avoided. Hydrodynamic effects in the liquid that are detrimental to the imaging quality can be avoided through a reduction of movement.

A slotted form of the illumination region is preferably provided.

In an advantageous manner, the mask and the semiconductor wafer, during the imaging of the structure, are provided with a fixed position in the x-y plane.

Preferably, the mask and the semiconductor wafer during the imaging of the structure, are provided such that they are movable in the x-y plane.

The above and still further aspects, features and advantages of the present invention will become apparent upon consideration of the following detailed description of a specific embodiment thereof, particularly when taken in conjunction with the accompanying drawings wherein like reference numerals in the various figures are utilized to designate like components.

BRIEF DESCRIPTION OF THE FIGURES

The invention is explained in more detail below with reference to the figures, in which:

FIG. 5 shows a sketch of a wafer surface during an exposure operation in accordance with an aspect of the present invention.

DETAILED DESCRIPTION

Figure 1:
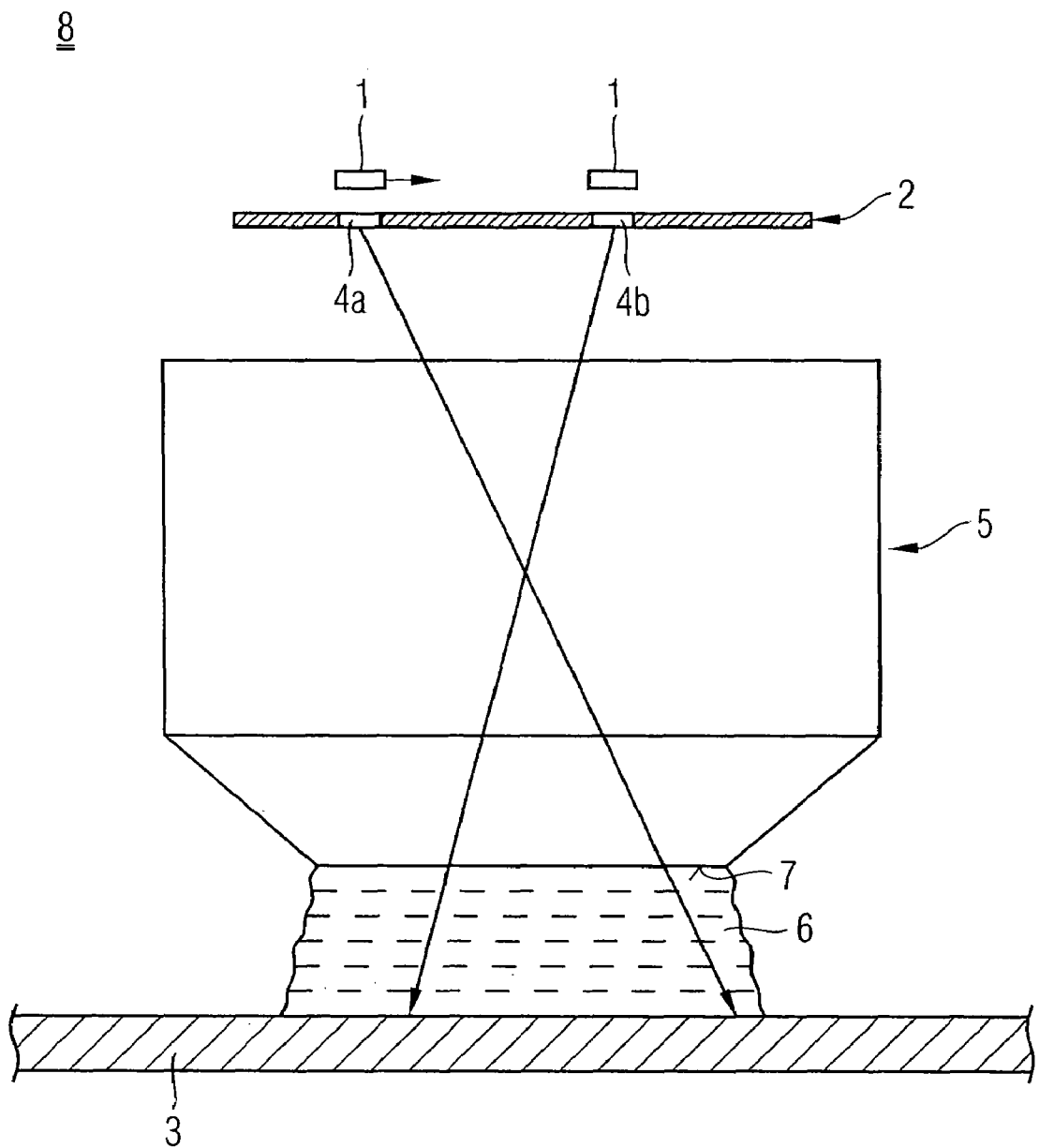
FIG. 1 shows a diagrammatic illustration of an imaging apparatus in accordance with an embodiment of the present invention.
Figure 2A:
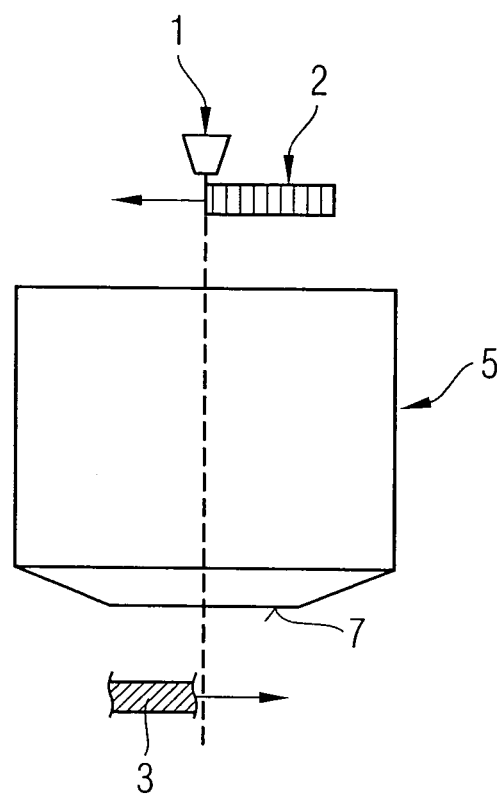
FIG. 2 shows a diagrammatic illustration of a conventional imaging apparatus.
Figure 2B:
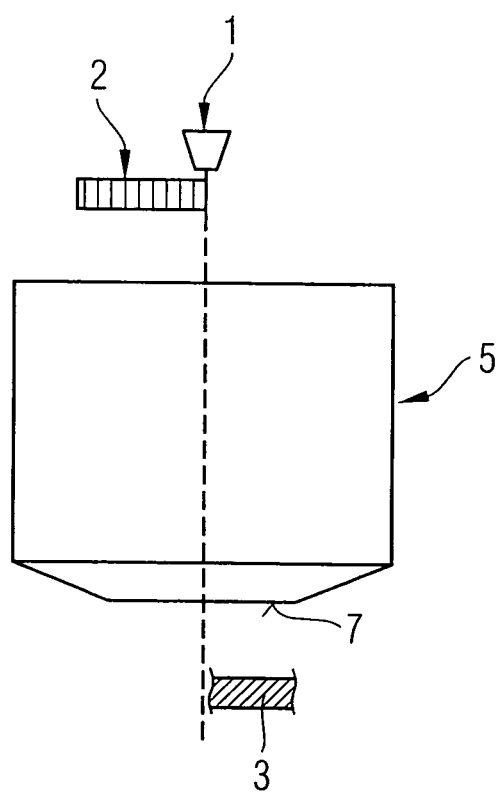

In accordance with the illustration in FIG. 1, an imaging apparatus 8 according to the invention has a movable illumination region 1 provided with a slotted form. The illumination region 1 illuminates a strip-type cutout 4 of a mask 2, a long side of the strip-type cutout 4 being provided with a length of an edge of the mask 2. The entire mask 2 can be illuminated progressively by means of a continuous movement of the illumination region 1 with a direction perpendicular to the edge, so that a structure contained in the mask 2 can be scanned.

FIG. 1 illustrates the imaging apparatus 8. The illumination region 1 shown illuminates a cutout 4a at one point in time and a cutout 4b of the mask 2 at a later point in time. A direction of movement of the illumination region 1 above the mask 2 is illustrated by an arrow at the illumination region 1. A partial structure contained in the illuminated cutout 4 can be imaged onto the semiconductor wafer 3 by a projection system 5 shown in FIG. 1. A liquid 6 evident from FIG. 1 can be provided between the semiconductor wafer 3 and a lens surface 7 of the projection system 5 that is nearest to the semiconductor wafer 3. The respective arrows at the illuminated cutouts 4a and 4b indicate the section of the semiconductor wafer 3 onto which the respective partial structures in the cutouts 4a and 4b are imaged. As is evident, the right and left sides are interchanged with one another by the projection system 5. Since the structure contained in the mask 2 can be completely scanned by the movement of the exposure opening 1, mask 2 and semiconductor wafer 3 are held in a fixed position relative to the projection system 5. A fixed positioning prevents a movement of the semiconductor wafer 3 with regard to the liquid 6 and thus hydrodynamic effects in the liquid 6 that are detrimental to an imaging quality.

Figure 3A:
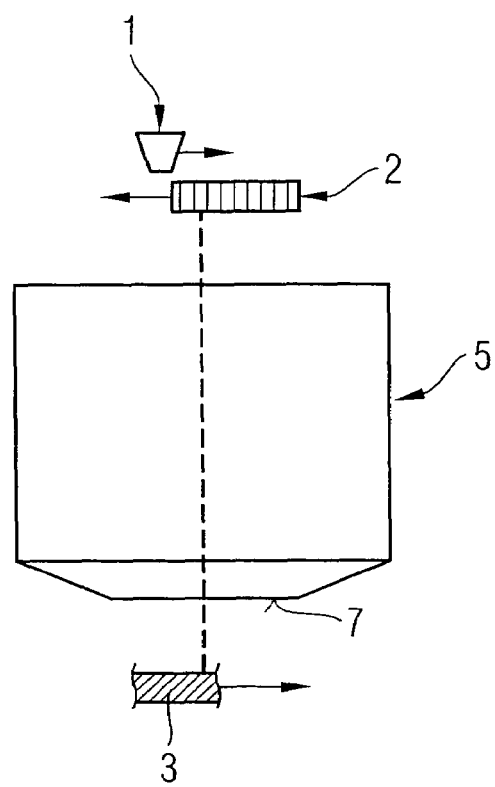
FIG. 3 shows a diagrammatic illustration of an imaging apparatus in accordance with an additional embodiment of the present invention.
Figure 3B:
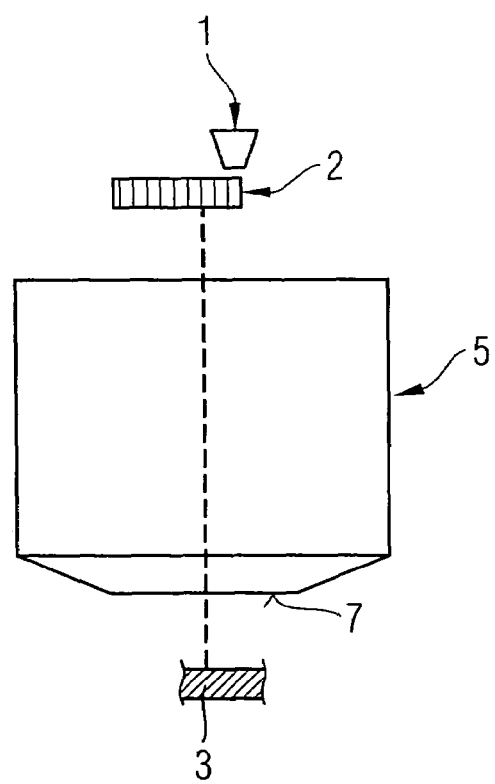

In accordance with an additional exemplary embodiment of the invention, both the illumination region 1, the mask 2 and the semiconductor wafer 3 are preferably provided in movement during the imaging operation. FIG. 3a illustrates the positions of the illumination region 1, the mask 2 and the semiconductor wafer 3 at the beginning of an imaging operation. The respective arrow at the illumination region 1, the mask 2 and the semiconductor wafer 3 indicates the direction of movement in which the respective objects are moved during the imaging operation. A center of movement about which the illumination region 1, the mask 2 and the semiconductor wafer 3 move is indicated by the dashed line running through the projection system 5 illustrated. By virtue of the fact that both the illumination region 1, the mask 2 and the semiconductor wafer 3 are in movement, an amplitude of the movement of the illumination region 1 can be reduced, as a result of which an image field can also be reduced again compared with a static arrangement of the semiconductor wafer 3 and the mask 2. The liquid 6 can be situated between the lens surface 7 and the semiconductor wafer 3, (liquid not being shown in this illustration) in which the movements of the mask 2 and the semiconductor wafer 3 are of importance. The positions of the illumination region 1, the mask 2 and the semiconductor wafer 3 at the end of an imaging operation are illustrated in FIG. 3b. As can be seen from the two positions of the illumination region 1 illustrated, the amplitude of the movement of the illumination region 1 has decreased compared with a static arrangement of mask 2 and semiconductor wafer 3.

After the imaging of the structure from the mask 2 onto a section of the semiconductor wafer 3, the semiconductor wafer 3 can be brought to a new position with regard to the projection system 5, so that a repeated imaging can be effected onto an as yet unexposed section of the semiconductor wafer 3.

Figure 4A:
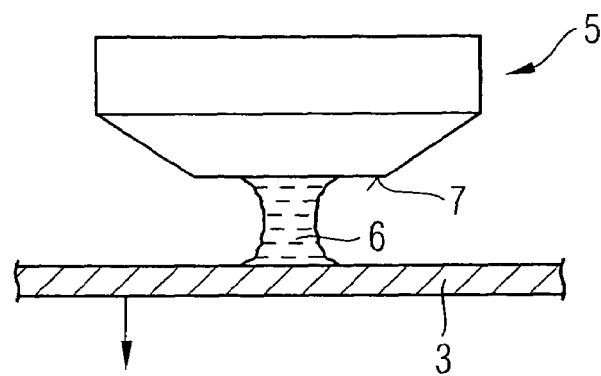
FIG. 4 shows a diagrammatic sequence of a movement of a semiconductor wafer in accordance with an additional embodiment of the present invention.
Figure 4B:
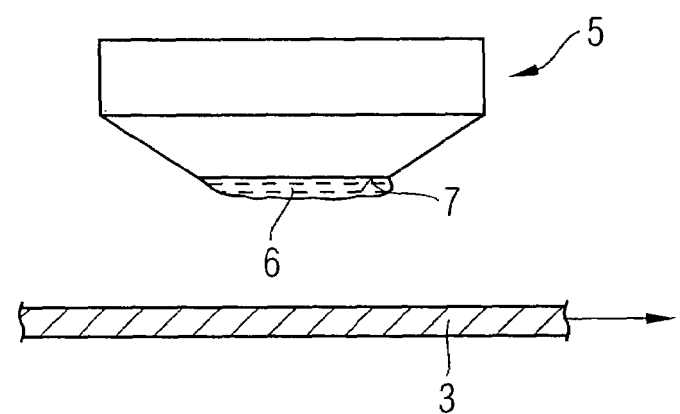
Figure 4C:
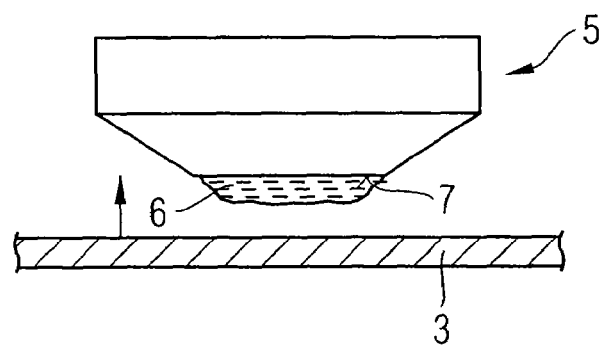
Figure 4D:
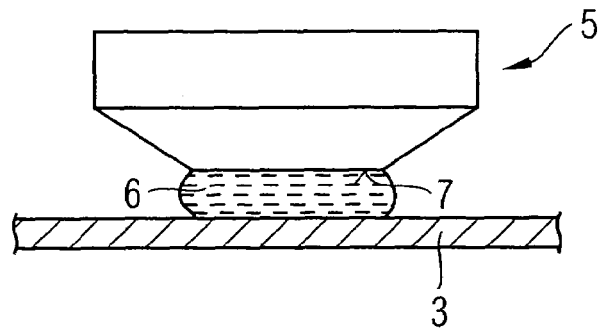

FIGS. 4a–d illustrate the individual directions of movement which the semiconductor wafer 3 has to execute for a repositioning. In FIG. 4a, the direction of movement of the semiconductor wafer 3 away from the lens surface 7 in the z direction is indicated by the arrow at the semiconductor wafer 3. The liquid 6 provided between lens surface 7 of the projection system 5 and semiconductor wafer 3 extends in length as the semiconductor wafer 3 moves away in the z direction. The movement can be executed until contact with the liquid 6 has been broken. This state is illustrated in FIG. 4b. FIG. 4b differs from FIG. 4a in that the liquid 6, after the movement of the semiconductor wafer 3 in the z direction, adheres below the lens surface 7 and can no longer be in contact with the semiconductor wafer 3. Once contact with the liquid 6 has been interrupted, the semiconductor wafer continues to be moved in the x-y plane until an as yet unexposed section of the semiconductor wafer 3 can be located below the projection system 5. This movement is indicated by the arrow in FIG. 4b. Once the semiconductor wafer 3 has been positioned in the x-y plane, a movement is effected in the z direction toward the lens surface 7. This movement is executed until a gap that is to be filled by the liquid 6 arises between lens surface 7 and semiconductor wafer 3. FIG. 4c illustrates the position of the semiconductor wafer after the movement in the z direction toward the lens surface 7. Afterward, a renewed liquid 6 can be introduced into the gap between the lens surface 7 and the semiconductor wafer 3. FIG. 4d shows the liquid 6 that completely fills the gap and is situated between the lens surface 7 of a lens of the projection system 5 illustrated and the wafer surface 3.

Once the liquid 6 has been introduced, small nanometer-scale focusing movements of the semiconductor wafer 3 are additionally effected. A need for such focusing movements is illustrated in FIG. 5.

FIG. 5 reveals a wafer surface 3a at two different points in time. As is evident, the wafer surface 3a is not completely planar. At one point in time, a cutout 4a evident from the figure can be exposed, the projection system prescribing a focal range having a depth b indicated in FIG. 5. The imaging will achieve a prescribed sharpness only when the wafer surface 3a is situated approximately within the focal range. The exposed cutout 4 migrates over the uneven wafer surface 3a, which is indicated by an arrow in the figure. The cutout 4b that can be exposed at a later point in time is brought into the focal range of the projection system 5 by a nanometer-scale movement in the z direction perpendicular to the plane in which the wafer surface 3a is situated.

Having described preferred embodiments of a new and improved method and imaging apparatus for imaging a structure onto a semiconductor wafer by means of immersion lithography, it is believed that other modifications, variations and changes will be suggested to those skilled in the art in view of teachings set forth herein. It is therefore to be understood that all such variations, modifications and changes are believed to fall within the scope of the present invention by the appended claims.

REFERENCE SYMBOLS

1 Illumination region
2 Mask
3 Semiconductor wafer
3a Wafer surface
4 Cutout
4a Cutout at one point in time
4b Cutout at a later point in time
5 Projection system
6 Liquid
7 Lens surface
8 Imaging apparatus

We claim:

1. A method for imaging a structure from a mask onto a semiconductor wafer, comprising the steps of:

exposing a cutout of the mask provided in an x-y plane with the aid of an illumination region arranged above the mask;

imaging a partial structure comprised in the exposed cutout onto the semiconductor wafer by means of a projection system;

filling a gap with liquid between the semiconductor wafer and a lens surface of the projection system that is nearest to the semiconductor wafer;

moving the illumination region with respect to the mask and the projection system in the x-y plane, so that the structure prescribed by the mask is imaged onto the semiconductor wafer by a sequence of imagings of the partial structure respectively contained in the successively exposed cutouts, in order to repeat the imaging of the structure on the semiconductor wafer;

interrupting a contact between the semiconductor wafer and the liquid;

moving the semiconductor wafer to a new position with regard to the projection system, so that the repeated imaging of the structure is effected onto an as yet unexposed section of the semiconductor wafer;

providing the liquid between the semiconductor wafer and the lens surface;

moving the semiconductor wafer into a focal range of the projection system; and repeating the imaging of the structure onto the semiconductor wafer.

2. The method as claimed in claim 1, wherein the illumination region includes a slotted form.

3. The method as claimed in claim 1, wherein the illumination region is moved in substantially one direction.

4. The method as claimed in claim 1, wherein the mask and the semiconductor wafer, during the imaging of the structure, are provided with a fixed position in the x-y plane with respect to the projection system.

5. The method as claimed in claim 1, wherein the mask and the semiconductor wafer, during the imaging of the structure, are moved in the x-y plane in each case with respect to the projection system.

6. The method as claimed in claim 5, wherein the semiconductor wafer is moved with a direction substantially parallel to the direction of movement of the illumination region and the mask is moved with a direction substantially antiparallel.

7. The method as claimed in claim 1, wherein in order to interrupt the contact between the semiconductor wafer and the liquid, the semiconductor wafer is moved away from the lens surface in a z direction substantially perpendicular to the x-y plane at least until contact with the liquid is broken.

8. The method as claimed in claim 7, wherein in order to bring the semiconductor wafer to the new position with regard to the projection system, the semiconductor wafer is moved in the x-y plane and the semiconductor wafer is moved in the z direction toward the lens surface until a gap between the semiconductor wafer and the lens surface is substantially filled by the liquid.

* * * * *